United States Patent
Obata et al.

(10) Patent No.: US 8,436,464 B2
(45) Date of Patent: May 7, 2013

(54) HOLLOW SEALING STRUCTURE AND MANUFACTURING METHOD FOR HOLLOW SEALING STRUCTURE

(75) Inventors: Susumu Obata, Yokohama (JP); Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 17 days.

(21) Appl. No.: 13/041,562

(22) Filed: Mar. 7, 2011

(65) Prior Publication Data

US 2011/0148045 A1 Jun. 23, 2011

Related U.S. Application Data

(62) Division of application No. 12/129,361, filed on May 29, 2008, now Pat. No. 7,932,116.

(30) Foreign Application Priority Data

May 31, 2007 (JP) ................................. 2007-145830

(51) Int. Cl.
*H01L 23/12* (2006.01)
(52) U.S. Cl.
USPC .................. 257/704; 257/678; 257/E29.167; 257/E29.324; 257/E23.188
(58) Field of Classification Search .................... 438/48, 438/52, 689, 736–738, 745; 257/678, 680, 257/257/704, E29.167, E29.324, E23.181–E23.183, 257/E23.188
See application file for complete search history.

(56) References Cited

U.S. PATENT DOCUMENTS

| | | | |
|---|---|---|---|
| 7,138,694 B2 | 11/2006 | Nunan et al. | |
| 7,144,750 B2 | 12/2006 | Ouellet et al. | |
| 7,795,723 B2 * | 9/2010 | Chau et al. | 257/704 |
| 7,952,189 B2 * | 5/2011 | Wan | 257/704 |
| 2007/0054433 A1 | 3/2007 | DeNatale et al. | |
| 2011/0121412 A1 * | 5/2011 | Quevy et al. | 257/415 |

FOREIGN PATENT DOCUMENTS

JP 2005-207959 8/2005

* cited by examiner

*Primary Examiner* — Matthew E Warren
(74) *Attorney, Agent, or Firm* — Oblon, Spivak, McClelland, Maier & Neustadt, L.L.P.

(57) ABSTRACT

A manufacturing method for a hollow sealing structure, includes, a process for filling a recessed portion in a principal surface of a substrate with a first sacrificial layer, a process for forming a functional element portion on the principal surface of the substrate, a process for forming a second sacrificial layer on the functional element portion so as to be connected to a part of the first sacrificial layer, a process for forming a covering portion over respective surfaces of the first and second sacrificial layers, a process for circulating a fluid for sacrificial layer removal through an opening in the covering portion in contact with the first sacrificial layer, thereby removing the first and second sacrificial layers, and a process for closing the opening.

10 Claims, 5 Drawing Sheets

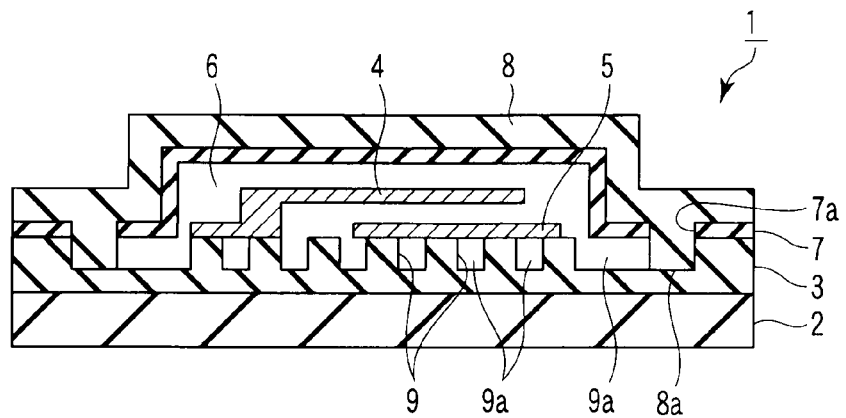
F I G. 3
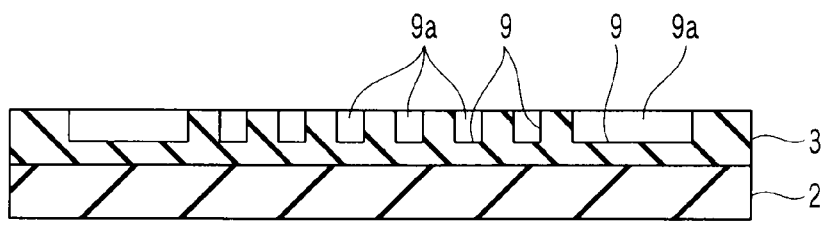
F I G. 4
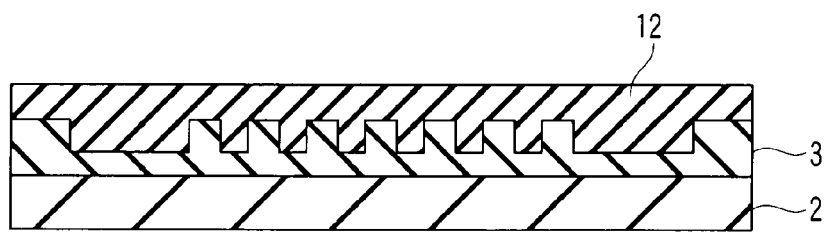
F I G. 5
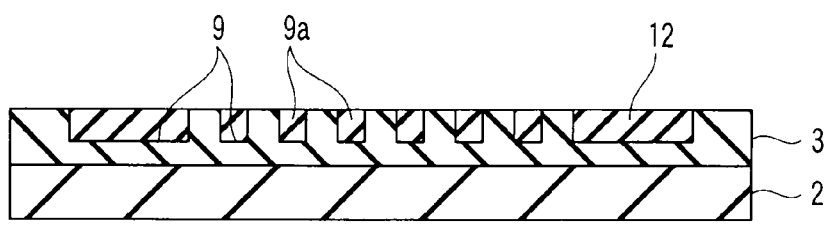
F I G. 6

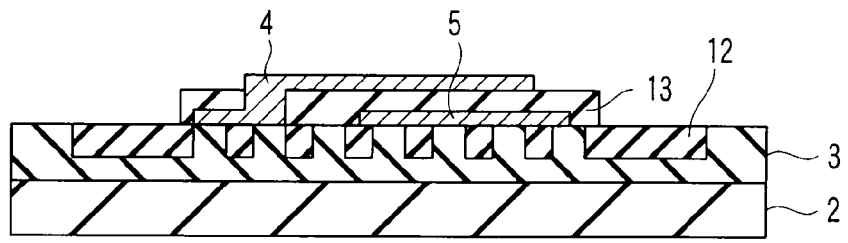
F I G. 7
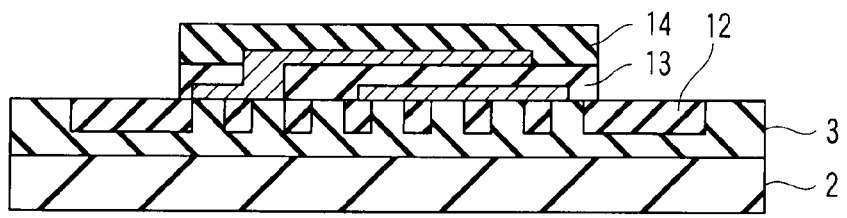
F I G. 8
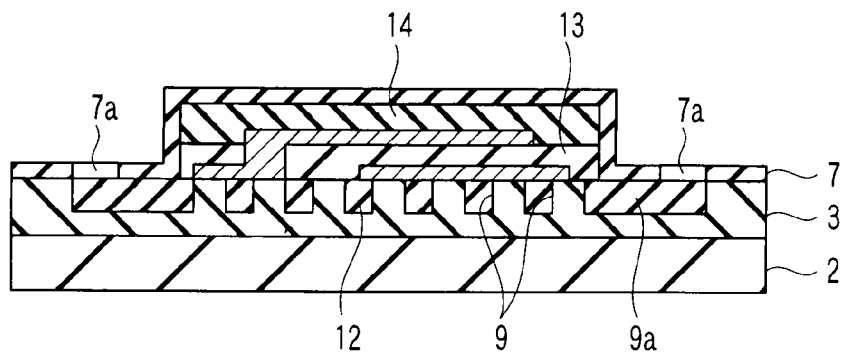
F I G. 9
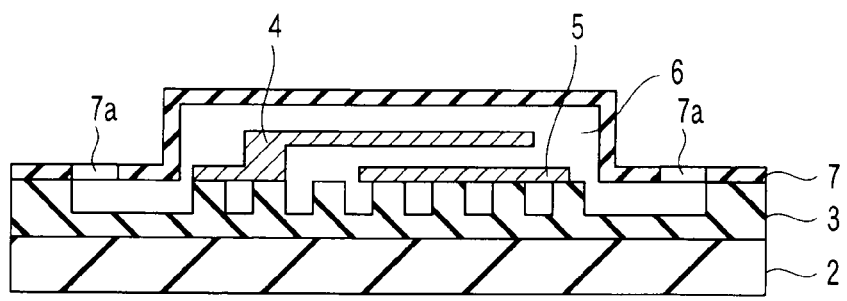
F I G. 10

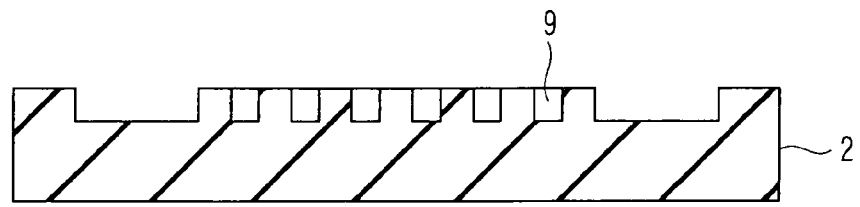
F I G. 11
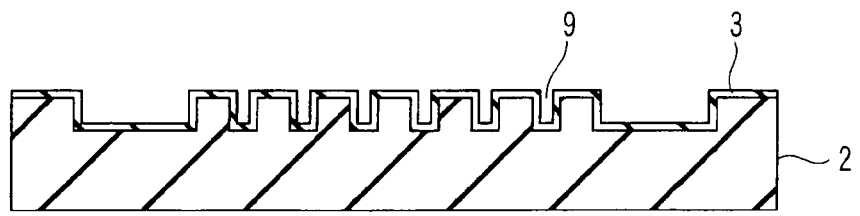
F I G. 12

HOLLOW SEALING STRUCTURE AND MANUFACTURING METHOD FOR HOLLOW SEALING STRUCTURE

CROSS-REFERENCE TO RELATED APPLICATIONS

This application is a division of and claims the benefit of priority under 35 U.S.C. §120 from U.S. Ser. No. 12/129,361 filed May 29, 2008, and claims the benefit of priority under 35 U.S.C. §119 from Japanese Patent Application No. 2007-145830 filed May 31, 2007, the entire contents of each of which are incorporated herein by reference.

BACKGROUND OF THE INVENTION

1. Field of the Invention

The present invention relates to a hollow sealing structure for a functional element, such as a microelectric machine part, micromachine packaging, etc., and a manufacturing method for the hollow sealing structure.

2. Description of the Related Art

There are known hollow sealing structures, such as an electric machine part for sealing an operational functional element mounted on a substrate in a hollow space. For example, a hollow sealing structure 21 shown in FIG. 18 is composed of a base substrate 22, a dielectric layer 23, a functional element 24, a signal conducting member 25, a gap portion 26, and first and second sealing members 27 and 28 as sealing members.

The functional element 24 has, for example, a doubly-supported beam structure such that the central part of a beam is separated from the signal conducting member 25 by several micrometers. The signal conducting member 25 of Au or the like is formed on the dielectric layer 23 immediately under the functional element 24. The functional element 24 is formed of TiN or Al with high elasticity. If it is subjected to a driving force, such as an electrostatic force, the functional element 24 is deformed so as to approach the signal conducting member 25. If the driving force is removed, the functional element 24 is restored to its original position by its own elasticity. Thus, the functional element 24 fulfills functions, such as variable capacitance change, switching, etc., as the distance from the signal conducting member 25 changes depending on the driving force.

A technique for sealing the functional element 24 in a hollow space for the ease of operation and protection is described in, for example, Jpn. Pat. Appln. KOKAI Publication No. 2005-207959. According to this technique, a thin film prepared by a film forming process is used to reduce the manufacturing cost and size of the element. As shown in FIG. 13, a sacrificial layer (first layer) 32 is formed on a substrate that is composed of the base substrate 22 and the dielectric layer 23. Then, the functional element 24 is formed on the sacrificial layer 32, as shown in FIG. 14. As shown in FIG. 15, a sacrificial layer (second layer) 33 is formed on the functional element 24 that is formed on the sacrificial layer 32. As shown in FIG. 16, opening portions 27a for the introduction of an etching material for sacrificial layer removal are formed in the first sealing member 27.

If the second sealing member 28 (mentioned later) is prepared by a film forming method, such as sputtering, vapor deposition, or CVD, a film material is deposited immediately under the opening portions 27a. Therefore, the opening portions 27a must be spaced from the functional element. Further, spaces for the circulation of the etching material must be secured between the upper surface of the dielectric layer 23 and those parts of the lower surface of the first sealing member 27 which are situated near the opening portions 27a. Then, the sacrificial layers 32 and 33 are thoroughly removed by introducing the etching material for sacrificial layer removal through the opening portions 27a, as shown in FIG. 17. Finally, the opening portions 27a are closed by forming the second sealing member 28 on the first sealing member 27, as shown in FIG. 18. Thereupon, a hollow sealing structure is completed such that the functional element is sealed in the hollow space, as shown in FIG. 18.

However, the above-described technique involves the following problems. In the aforesaid structure, the first sealing member must be made large enough to secure the circulation of the etching material for sacrificial layer removal. Accordingly, the hollow sealing structure and the sacrificial layers therein are increased in size, and the removal of the sacrificial layers takes longer. Further, a load produced by a pressure difference between the inside and outside also increases, thereby possibly causing contact with and breakage of the functional element.

The present invention has been made in order to solve these problems, and its object is to provide a hollow sealing structure and a manufacturing method therefor, capable of miniaturization of the hollow sealing structure and reduction in time for the removal of sacrificial layers therein.

BRIEF SUMMARY OF THE INVENTION

According to an aspect of the invention, a manufacturing method for a hollow sealing structure, comprises, a process for filling a recessed portion in a principal surface of a substrate with a first sacrificial layer, a process for forming a functional element portion on the principal surface of the substrate, a process for forming a second sacrificial layer on the functional element portion so as to be connected to a part of the first sacrificial layer, a process for forming a covering portion over respective surfaces of the first and second sacrificial layers, a process for circulating a fluid for sacrificial layer removal through an opening in the covering portion in contact with the first sacrificial layer, thereby removing the first and second sacrificial layers, and a process for closing the opening.

According to another aspect of the invention, a manufacturing method for a hollow sealing structure comprises, a process for forming a recess sacrificial layer which fills a recessed portion in a principal surface of a substrate, a process for further forming a step sacrificial layer of a predetermined shape on a signal conducting member formed on the substrate, a process for forming a functional element portion over the step sacrificial layer and a principal surface of the substrate, the functional element portion integrally including a support portion supported by the substrate and a beam portion supported by the support portion in a manner such as to be spaced from the substrate by the step sacrificial layer therebetween, a process for forming a second sacrificial layer on the functional element portion so as to be connected to a part of the step sacrificial layer, a process for forming a covering portion over respective surfaces of first and second sacrificial layers which are composed of the recess sacrificial layer and the step sacrificial layer, a process for circulating a fluid for sacrificial layer removal through an opening in the covering portion in contact with the first sacrificial layer, thereby removing the first and second sacrificial layers, and a process for closing the opening.

According to another aspect of the invention, a hollow sealing structure comprises, a substrate formed with a functional element portion on a predetermined principal surface thereof and a recess surrounding the functional element portion, a covering portion formed on the principal surface of the substrate covering the recess and the functional element portion in a spaced manner, and a sealing portion disposed so as to close an opening located in that region of the covering portion which adjoins the recess.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a sectional view of the hollow sealing structure;

FIG. 4 is a sectional view showing a manufacturing process for the hollow sealing structure;

FIG. 5 is a sectional view showing a manufacturing process for the hollow sealing structure;

FIG. 6 is a sectional view showing a manufacturing process for the hollow sealing structure;

FIG. 7 is a sectional view showing a manufacturing process for the hollow sealing structure;

FIG. 8 is a sectional view showing a manufacturing process for the hollow sealing structure;

FIG. 9 is a sectional view showing a manufacturing process for the hollow sealing structure;

FIG. 10 is a sectional view showing a manufacturing process for the hollow sealing structure;

FIG. 11 is a sectional view showing a manufacturing process for a hollow sealing structure according to another embodiment;

FIG. 12 is a sectional view showing a manufacturing process for a hollow sealing structure according to a further embodiment;

DETAILED DESCRIPTION OF THE INVENTION

Figure 1:
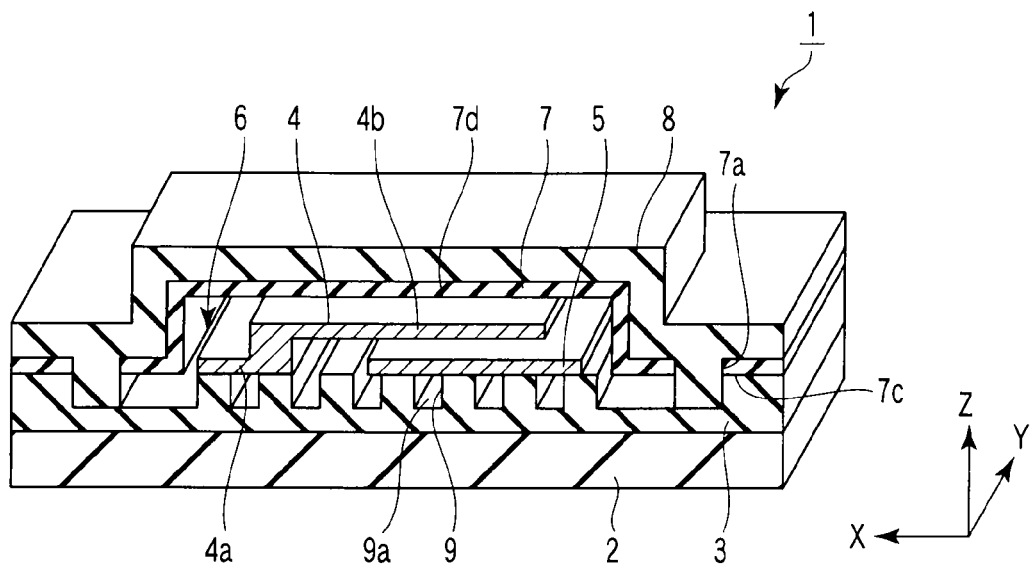
FIG. 1 is a perspective view, partially in section, showing a hollow sealing structure according to an embodiment of the invention.

A sealing structure according to a first embodiment of the present invention will now be described with reference to FIGS. 1 and 3. In each of these drawings, configurations are schematically shown in an enlarged or reduced scale or omitted as required. A second sealing member 8 is not shown in FIG. 2.

A hollow sealing structure 1 is a microelectric machine part, for example. It is composed of a base substrate 2, a dielectric layer 3, a functional element 4 (functional element portion), a signal conducting member 5, and a gap portion 6. Further, the sealing structure 1 includes a first sealing member 7 as a covering portion, which forms a hollow structure portion, and the second sealing member 8 as a sealing portion that closes openings in the first sealing member 7.

The base substrate 2 is formed of a plate of, for example, silicon (Si).

The dielectric layer 3, which is formed on the base substrate 2, is a film of silicon oxide ($SiO_2$), for example. The dielectric layer 3 is formed with groove structure portions 9 as recessed portions, of which respective bottom portions 9b are situated below an upper surface (principal surface) 3a of the dielectric layer 3. The groove structure portions 9 are formed by patterning in a mesh such that they extend longitudinally and transversely on the dielectric layer 3. They are arranged under and around the functional element 4 and the signal conducting member 5. The groove structure portions 9 form passage portions 9a, which are arranged under and around the functional element 4 and the signal conducting member 5. The passage portions 9a communicate with openings 7a of the first sealing member 7 (mentioned later) through the dielectric layer 3 under the first sealing member 7.

The signal conducting member 5 and the functional element 4 are formed on the upper surface 3a of the dielectric layer 3. The signal conducting member 5 is formed of Au or the like and has a rectangular shape that extends in a Y-direction as illustrated in the drawings.

The functional element 4 is formed on the upper surface 3a of the dielectric layer 3. The functional element 4 is a micromachine that includes a movable mechanism and has the form of a cantilever with a step. It is provided integrally with a support portion 4a and a beam portion 4b with the step between them. The support portion 4a is supported by the upper surface 3a of the dielectric layer 3, and the beam portion 4b as a movable portion extends horizontally from the upper end portion of the support portion 4a. The beam portion 4b is several micrometers above the signal conducting member 5. The functional element 4 is formed of TiN or Al with high elasticity. If it is subjected to a driving force, such as an electrostatic force, the functional element 4 approaches the signal conducting member 5. If the driving force is removed, the functional element 4 is restored to its original position by its own elasticity. Thus, the functional element 4 fulfills functions, such as variable capacitance change, switching, etc., as it is deformed so that the distance from the signal conducting member 5 changes depending on the driving force.

The first sealing member 7 is formed integrally with a support portion 7c and a spaced portion 7d. The support portion 7c is situated around the functional element 4. The spaced portion 7d is spaced from the functional element 4 and covers the functional element 4 from above with a gap therebetween. The support portion 7c of the first sealing member 7 is supported on a surface portion of the dielectric layer 3 so as to bridge the groove structure portions 9. The groove structure portions 9 form the passage portions 9a under the support portion 7c. The support portion 7c is provided with the openings 7a that are vertically penetrated by the first sealing member 7. The openings 7a are arranged side by side around the functional element 4 at a sufficient distance therefrom. Thus, the functional element 4 cannot be influenced by the second sealing member 8 (mentioned later) that is deposited under the openings 7a. The openings 7a are located adjacent to the groove structure portions 9, that is, over them in this case, so as to communicate with them. Thus, the gap portion 6 defined inside the first sealing member 7 communicates with the exterior of the sealing member 7 by means of the openings 7a and the passage portions 9a.

The second sealing member 8 is formed on the first sealing member 7 so as to externally cover the first sealing member 7 including the openings 7a, thereby closing the openings 7a. The second sealing member 8 is partially embedded under the openings 7a. The second sealing member 8 hermetically closes the gap portion 6 inside the first sealing member 7, whereby the functional element 4 is sealed in a hollow space.

A manufacturing method for the hollow sealing structure 1 according to the present embodiment will now be described with reference to FIGS. 4 to 10.

First, as shown in FIG. 4, the dielectric layer 3 is formed on the base substrate 2, and the groove structure portions 9 are formed by patterning on the dielectric layer 3. As shown in FIG. 5, a recess sacrificial layer 12 as a first sacrificial layer is formed using, for example, polycrystalline silicon, which can be removed by a reactive gas, on the dielectric layer 3 including the groove structure portions 9. The groove structure portions 9 are filled up by the recess sacrificial layer 12.

The recess sacrificial layer 12 is leveled by etching-back or chemical-mechanical polishing (CMP), as shown in FIG. 6. Then, the signal conducting member 5 is formed on the leveled recess sacrificial layer 12, as shown in FIG. 7.

Subsequently, an electrostatically-driven high-frequency switch is formed as the functional element 4 having a cantilever structure using, for example, gold (Au) as a component material. When this is done, a step sacrificial layer 13 of a predetermined shape as the first sacrificial layer is formed to create a step on the signal conducting member 5, and the functional element 4 is formed on the step sacrificial layer 13. Thereupon, the functional element 4 is formed in a predetermined shape having the support portion 4a and the beam portion 4b, as well as the step. Thus, according to the present embodiment, the first sacrificial layer is composed of the recess sacrificial layer 12 and the step sacrificial layer 13.

As shown in FIG. 8, moreover, a second sacrificial layer 14 is formed using, for example, polycrystalline silicon, which can be removed by a reactive gas, so as to cover the functional element 4. When this is done, the second sacrificial layer 14 is formed so as to be connected to a part of the step sacrificial layer 13 as the first sacrificial layer.

As shown in FIG. 9, the first sealing member 7 is formed using, for example, a silicon nitride (SiN) film on the second sacrificial layer 14. When this is done, the vertically penetrating openings 7a are formed in positions distant from the functional element 4 by patterning. Thus, the second sacrificial layer 14 is not covered by the first sealing member 7 in positions corresponding to the openings 7a.

Then, as shown in FIG. 10, the recess sacrificial layer 12, step sacrificial layer 13, and second sacrificial layer 14 are removed through the openings 7a. These layers are removed through the passage portions 9a that communicate with the openings 7a by introducing, for example, XeF$_2$ gas, which selectively removes polycrystalline silicon, through the openings 7a.

As the recess sacrificial layer 12, step sacrificial layer 13, and second sacrificial layer 14 are simultaneously removed in this manner, the gap portion 6 is formed inside the first sealing member 7. Since the recess sacrificial layer 12 in the groove structure portions 9 formed under the functional element 4 and the signal conducting member 5 is also removed, moreover, the functional element 4 and the signal conducting member 5 partially float above the base substrate 2 and the dielectric layer 3.

After the gap portion 6 is formed, a silicon nitride (SiN) film that is thick enough to fill the openings 7a, for example, is deposited from above the first sealing member 7 to form the second sealing member 8.

Figure 2:
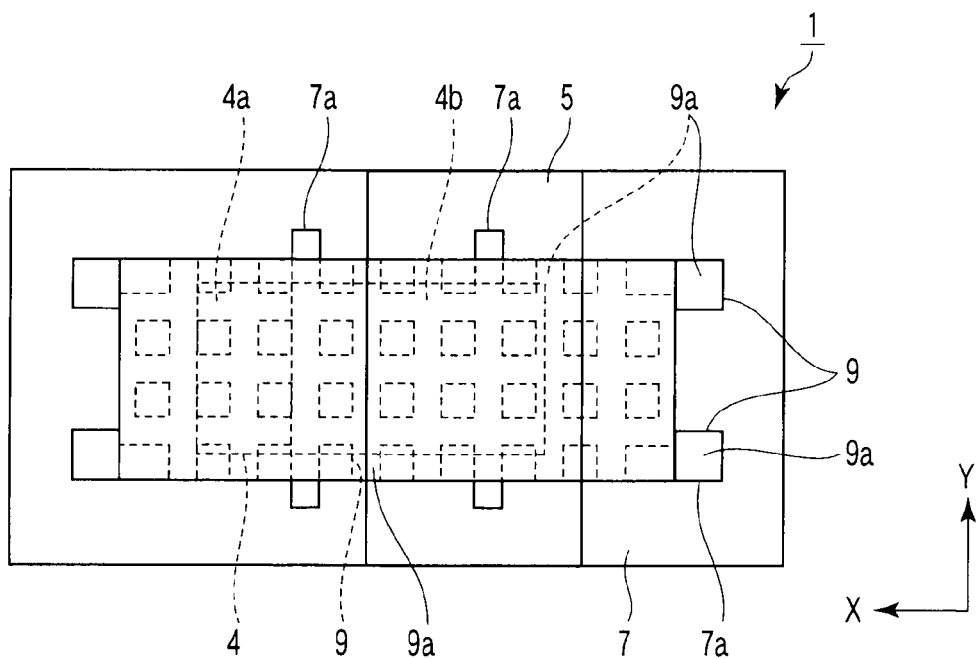
FIG. 2 is a plan view of the hollow sealing structure.
Figure 13:
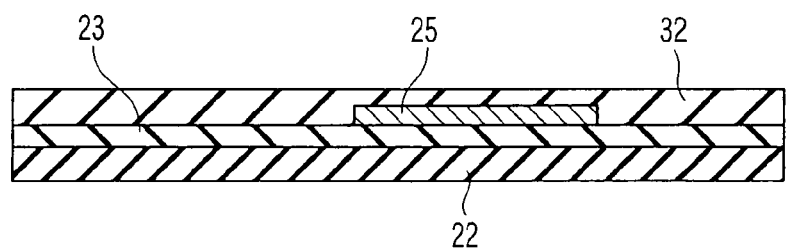
FIG. 13 is a sectional view showing an example of a manufacturing process for a hollow sealing structure.
Figure 14:
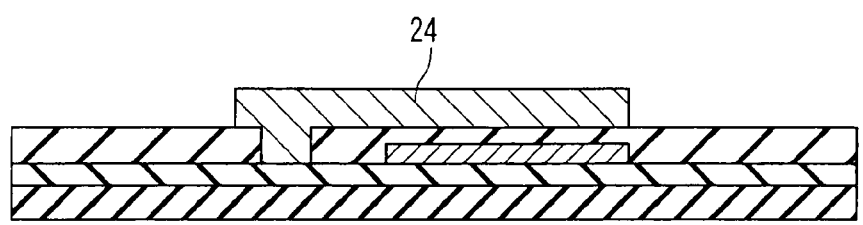
FIG. 14 is a sectional view showing an example of a manufacturing process for the hollow sealing structure.
Figure 15:
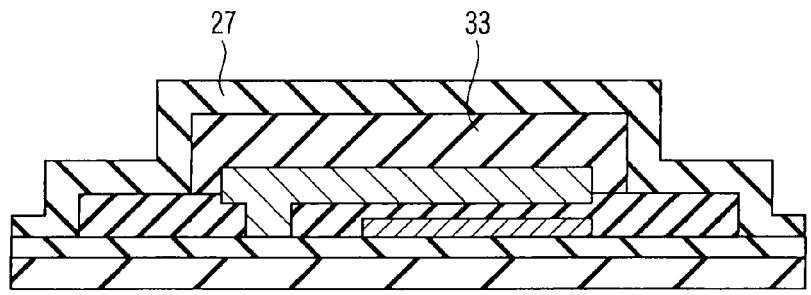
FIG. 15 is a sectional view showing an example of a manufacturing process for the hollow sealing structure.
Figure 16:
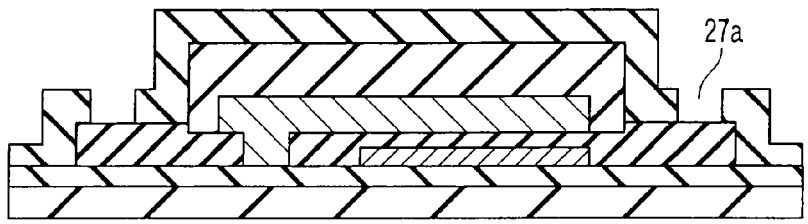
FIG. 16 is a sectional view showing an example of a manufacturing process for the hollow sealing structure.
Figure 17:
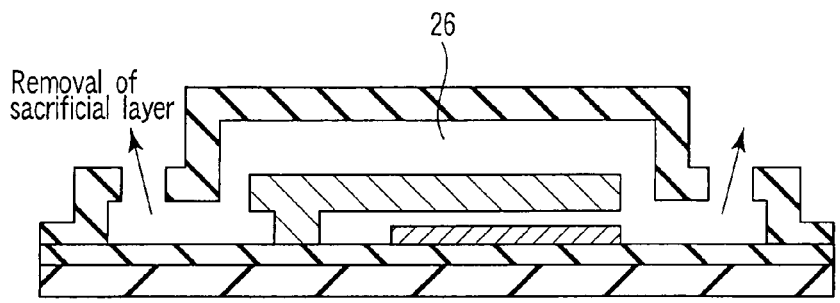
FIG. 17 is a sectional view showing an example of a manufacturing process for the hollow sealing structure.
Figure 18:
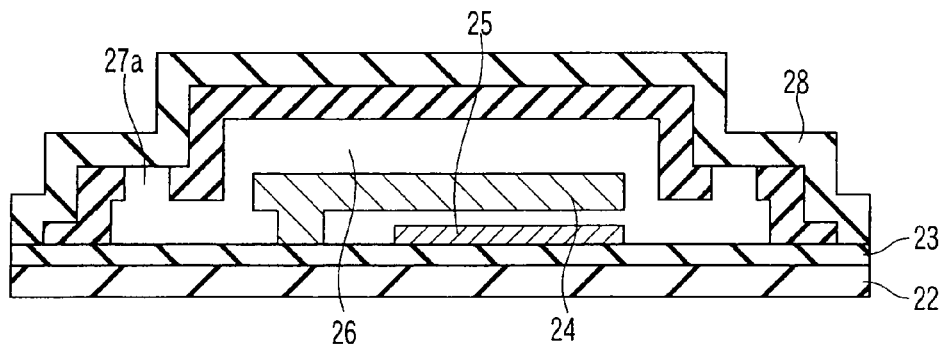
FIG. 18 is a sectional view showing an example of the hollow sealing structure.

Thus, the openings 7a are hermetically closed by the second sealing member 8 so that the functional element 4 in the gap portion 6 is sealed by the first and second sealing members 7 and 8, whereupon the hollow sealing structure 1 shown in FIGS. 1 to 3 is completed.

The hollow sealing structure 1 according to the present embodiment and its manufacturing method produce the following effects. The dielectric layer 3 is formed with the passage portions 9a that connect the exterior and interior of the first sealing member 7 through the openings 7a, and the sacrificial layers are removed through the passage portions 9a. By doing this, the first and second sealing members 7 and 8 can be located closer to the base substrate 2, the upper surface of the dielectric layer 3, and the functional element 4 than in the case where the groove structure portions 9 are not provided, so that the hollow sealing structure 1 can be reduced in overall size. Specifically, the support portion 7c is supported on the principal surface of the dielectric layer 3, and the passage portions 9a, each in the form of a groove with a vertically recessed bottom, are arranged directly under the support portion 7c. By doing this, the first sealing member 7 can be formed directly on the principal surface without the necessity of providing the first sealing member 7 with any steps for gas introduction. Accordingly, a space between the first sealing member and the principal surface of the dielectric layer 3, which is needed in securing a gas passage when the principal surface is flat, can be omitted. The respective volumes of the hollow sealing structure itself and the sacrificial layers therein can be reduced, so that the structure can be miniaturized, and the time for the removal of the sacrificial layers can be shortened.

Further, the groove structure portions 9 are distributed under the functional element 4 and the signal conducting member 5, so that the functional element 4 and the signal conducting member 5 partially float above the base substrate 2 and the dielectric layer 3, thereby making the structure apparently porous. Thus, the apparent dielectric constant of the base substrate 2 can be lowered so that parasitic capacitances between the base substrate 2, functional element 4, and signal conducting member 5 can be reduced to improve the high-frequency characteristics.

The present invention is not limited to the embodiment described above, and the materials, shapes, layouts, sizes, constructions, operations, etc., of its component elements may be modified as required. Examples of patterning methods and methods for sacrificial layer removal include dry etching with an etching gas, wet etching with chemicals, etc. Further, the recess sacrificial layer 12, step sacrificial layer 13, and second sacrificial layer 14 need not always be identical.

In the manufacturing method according to the first embodiment described above, moreover, the substrate is obtained by forming the dielectric layer 3 on the base substrate 2. Alternatively, however, the groove structure portions 9 may be formed by directly patterning the base substrate 2 that is used alone as the substrate without forming the dielectric layer 3, as shown in FIG. 11. As shown in FIG. 12, furthermore, the patterned groove structure portions 9 may be fabricated by forming the dielectric layer 3 of a silicon oxide film on the surface of the base substrate 2 by thermal oxidation. The structure of the recessed portion may be a tunnel structure that penetrates the base substrate 2. Further, the leveling process shown in FIG. 6 may be omitted. Although the first sacrificial layer has been described as having a dual structure including the recess sacrificial layer 12 and the step sacrificial layer 13, furthermore, the step sacrificial layer 13 may be omitted.

In carrying out the invention, moreover, its components may be embodied in modified forms without departing from the scope or spirit of the invention. Further, various inventions may be made by suitably combining a plurality of components described in connection with the foregoing embodiment. For example, some of the components according to the foregoing embodiment may be omitted. Furthermore, components according to different embodiments may be combined as required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A hollow sealing structure comprising:
   a base substrate;
   an insulating layer layered on the base substrate, the insulating layer formed with a functional element portion on a predetermined principal surface thereof and a recess surrounding the functional element portion;
   a covering portion formed on the principal surface of the insulating layer covering the functional element portion in a spaced manner and having an opening on the recess;
   a passage portion formed in the insulating layer and connecting the exterior and interior of the covering portion through the opening; and
   a sealing portion disposed so as to close an opening located in that region of the covering portion which adjoins the recess.

2. The hollow sealing structure according to claim 1, wherein the functional element portion is a micromachine including a movable mechanism.

3. The hollow sealing structure according to claim 1, wherein the sealing portion hermetically contacts the insulating layer through the opening.

4. The hollow sealing structure according to claim 1, wherein the opening penetrates the covering portion in a direction orthogonal to the principal surface.

5. The hollow sealing structure according to claim 1, wherein a signal conducting wire formed along the functional element portion and the principal surface of the insulating layer, a part of the signal conducting wire spaced from the base substrate and the insulating layer.

6. A hollow sealing structure comprising:
   a base substrate formed with a functional element portion on a predetermined principal surface thereof and a recess surrounding the functional element portion;
   an insulating layer formed on the base substrate;
   a covering portion formed on the principal surface of the insulating layer, the covering portion covering the functional element portion in a spaced manner and forming an opening on the recess;
   a passage portion formed in the insulating layer, the passage potion connecting the exterior and interior of the covering portion through the opening; and
   a sealing portion disposed so as to close an opening located in that region of the covering portion which adjoins the recess.

7. The hollow sealing structure according to claim 6, wherein the functional element portion is a micromachine including a movable mechanism.

8. The hollow sealing structure according to claim 6, wherein the sealing portion hermetically contacts the insulating layer through the opening.

9. The hollow sealing structure according to claim 6, wherein the opening penetrates the covering portion in a direction orthogonal to the principal surface.

10. The hollow sealing structure according to claim 6, wherein a signal conducting wire formed along the functional element portion and the principal surface of the insulating layer, a part of the signal conducting wire spaced from the base substrate and the insulating layer.

* * * * *